United States Patent [19]

Ashar

[11] 3,787,253

[45] Jan. 22, 1974

[54] EMITTER DIFFUSION ISOLATED SEMICONDUCTOR STRUCTURE

[75] Inventor: Kanu Ashar, Wappingers Falls, N.Y.

[73] Assignee: International Business Machines Corporation, Armonk, N.Y.

[22] Filed: Dec. 17, 1971

[21] Appl. No.: 209,237

[52] U.S. Cl. .................... 148/175, 29/577, 117/201, 148/187, 317/235 R

[51] Int. Cl. .......................... H01l 7/36, H01l 19/00

[58] Field of Search .... 148/175, 187; 317/234, 235; 117/201, 212, 213; 29/577, 578

[56] References Cited

UNITED STATES PATENTS

| | | | |
|---|---|---|---|
| 3,575,741 | 4/1971 | Murphy | 148/175 |
| 3,596,149 | 7/1971 | Makimoto | 317/235 |
| 3,524,113 | 8/1970 | Agusta et al. | 317/235 |
| 3,615,932 | 10/1971 | Makimoto et al. | 148/175 |

OTHER PUBLICATIONS

Murphy et al., "Collector Diffusion Isolated Integrated Circuits", Proc. IEEE, Vol. 57, No. 9, Sept. 1969, pp. 1,523–1,527

Berger et al., "Semiconductor Structure", IBM Tech. Discl. Bull., Vol. 13, No. 1, June 1970, p. 295.

*Primary Examiner*—Dewayne Rutledge
*Assistant Examiner*—W. G. Saba
*Attorney, Agent, or Firm*—J. Jancin, Jr. et al.

[57] ABSTRACT

An improved self-isolated semiconductor integrated circuit structure is formed by a novel process beginning with diffusing a plurality of N-type buried layers onto a P-type substrate and epitaxially growing a thin P-type layer over the surface of the P-type substrate. Base regions are formed by diffusing a plurality of P-type regions into the P-type epitaxial layer. Collector contact regions and emitter regions are formed by simultaneously diffusing a plurality of N-type regions into the P-type epitaxial layer, the collector contact regions being spaced from the P-type base region and diffused through the epitaxial layer to contact the N-type buried layer, and the emitter regions being diffused within the P-type base regions. A semiconductor integrated circuit structure results having base regions with controllable wide range concentration levels, formed with only three selective diffusion process steps.

2 Claims, 9 Drawing Figures

PATENTED JAN 22 1974

3,787,253

EMITTER DIFFUSION ISOLATED SEMICONDUCTOR STRUCTURE

1. FIELD OF THE INVENTION

This invention relates to semiconductor devices and, more particularly, to self-isolated semiconductor integrated circuit structures and the process for making them.

2. PRIOR ART

Early isolation techniques used in manufacturing junction-isolated semiconductor integrated circuits generally consist of forming an N-type epitaxial layer onto a P-type substrate and then diffusing P-type isolation zones through the N-type epitaxial layer to intersect the P-type substrate. If a low resistivity N-type path is desired, prior to forming the N-type epitaxial layer, a highly doped N-type buried layer is diffused into the P-type substrate. In either case, N-type islands are formed which are effectively isolated electrically from each other because of the double junctions which are formed, constituting back-to-back junction diodes. To complete the low resistivity N-type path, highly doped, narrow N-type zones are diffused through the N-type epitaxial layer, contacting the N-type buried layer. Using the low resistivity N-type buried layer with or without the narrow N-type zones, all of which is enclosed by the P-type isolation zones, transistors, resistors, crossunders and diodes may be formed using standard integrated circuit techniques.

These early isolation techniques have more recently been improved upon by techniques which reduce the area per functional unit and also reduce the number of diffusion steps, both reductions offering valuable economic savings. Generally, these devices are formed by diffusing a highly doped N-type buried layer into a P-type substrate, a P-type layer is then epitaxially grown on the surface of the P-type substrate and then islands are formed by diffusing a highly doped N-type isolation region through the P-type epitaxial layer around the periphery of the N-type buried layer until the N-type isolation region contacts the N-type buried layer. In the situation where a transistor is the functional device, another diffusion in the P-type region isolated by the N-type isolation region is required. Thus, the N-type buried layer and isolation region functioning as a collector region isolate an island of the P-type epitaxial layer which becomes the base region and the N-type region formed by a final diffusion step in the P-type epitaxial region is the emitter region.

An improvement of this more recent technique is the nonselective diffusion into the surface of the P-type epitaxial layer of more P-type impurities after the diffusion of the N-type isolation region. This results in a device with the further advantages of a low effective surface recombination velocity, control of the composite base sheet resistance, inhibition of the formation of a surface inversion layer and minimization of edge injection from the emitter. However, this diffusion step can be performed without a mask only when the base region is to have a lower surface concentration than the collector-isolation region, thus limiting the concentration level of the base region. In other words, to achieve a base concentration level sufficiently high enough for improved performance an additional masked diffusion is necessary, adversely effecting the yield. Higher concentrations in the base region are desirable because they increase the performance of the device, because high concentration in the base region allows short base-width without imposing low punch through voltage, lower base resistance, and considerable reduction of the base stretching phenomenon at high current density thus permitting smaller transistor geometry and lower collector capacitance. Since the performance of a transistor is directly dependent upon the ratio of the cutoff frequency to the product of the base resistance and collector capacitance, lower base resistance and collector capacitance, both the result of a base with a high concentration, is desirable.

A second technique for forming the more recent isolation structure has been employed. Using this second technique, the buried N-type layer is formed into two regions, each with different outward diffusion coefficient, the region with the faster coefficient surrounding the slower region. This may be achieved by either the use of two kinds of impurities having different diffusion coefficients or by selectively forming the different impurity-concentration layer, either method increasing the number of diffusion steps which detracts from the economy of the process. When a P-type layer is epitaxially grown on the surface of the P-type substrate, the two regions of the buried N-type layer outwardly diffused resulting in the surrounding region extending closer to the surface of the P-type epitaxial layer than the surrounded region. Finally, an N-type isolation region and an N-type emitter region are formed by a simultaneous diffusion step into the P-type epitaxial surface. This second technique results in a device similar to the device of the first technique and shares with it the same general disadvantages of a relatively low base concentration region. Both techniques are performed using basically three selective diffusion steps, requiring a fourth selective diffusion step to increase the base concentration to a desired level.

Therefore, it is a primary object of this invention to increase the base concentration of an isolated transistor device without increasing the number of diffusion steps.

Further, it is another object of this invention to improve the performance of an isolated transistor device without increasing the number of diffusion steps.

It is still another object of this invention to reduce the functional area required per device.

It is a still further object of this invention to increase the range of base concentration of an isolated transistor device without increasing the number of diffusion steps.

SUMMARY OF THE INVENTION

The above objects are accomplished by diffusing (first masked diffusion) into a substrate of a first conductivity type a plurality of buried layer regions of a second conductivity type and then epitaxially growing a thin layer of the first conductivity type on the entire surface of the substrate. Base regions are formed by selectively diffusing (second masked diffusion) a plurality of regions of the first conductivity type into the epitaxial layer. Since this is a masked diffusion, the range of concentration levels is maximum, permitting the formation of high concentration base regions. Finally, the collector contacts and the emitter regions, both of the second conductivity type, are simultaneously diffused (third masked diffusion) into the epitaxial layer. The emitter regions are positioned within the diffused base regions and the collector contact regions are spaced from the diffused base regions. Since the collector contact regions are diffused into the epitaxial layer in areas of lower concentration than where the emitter regions are diffused, the collector contacts reach the buried layer regions while the emitter regions remain completely within the base regions. Using this technique, self-isolated semiconductor integrated circuits are formed in three selective diffusion process steps while, at the same time, permitting high concentration base regions to be formed.

By maintaining the low number process steps a high yield is maintained and, since the base stretching phenomenon at high current density is considerably reduced with high base concentration, smaller transistor geometry is achieved, thus further increasing the yield. Further, the lower base resistance and lower collector capacitance in conjunction with the short base width, all resulting from the high base concentration, significantly increase the performance of the device.

DETAILED DESCRIPTION

Generally speaking, performance of a transistor depends upon three factors: the cutoff frequency, the base resistance and the collector capacitance. Roughly speaking, the speed of a switching circuit and maximum frequency of oscillation for a linear circuit depend upon the ratio of the cutoff frequency to the product of the base resistance times the collector capacitance. Since the cutoff frequency is inversely proportional to the square of the basewidth, performance can be significantly improved by decreasing the basewidth, the base resistance, and the collector capacitance. In existing semiconductor integrated circuit structures such as the self-isolated transistor, the reduction of these parameters and thus the increase in performance can best be achieved by increasing the base concentration to a range of $10^{16}cm^{-3}$ to $10^{19}cm^{-3}$. The difficulty with existing self-isolated transistor fabrication techniques is that to increase the base concentration to the desired range requires an additional selective or masked diffusion process step, an undesirable requirement since the yield is inversely proportional to the number of masked diffusion steps. Two existing processes for the fabrication of self-isolated transistors, shown in FIGS. 1A and 1B, illustrate this point.

Figure 1A:
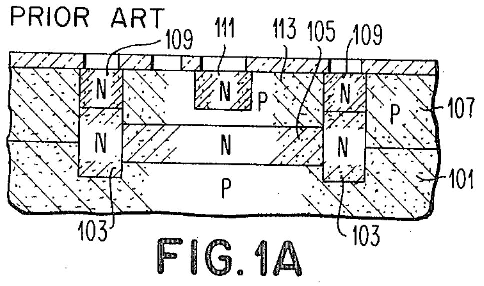
FIGS. 1A and 1B show prior art self-isolated transistor structures.

FIG. 1A shows the cross sectional view of a prior art self-isolated semiconductor integrated circuit structure in which the self-isolation results from the utilization of a buried layer region having two different outward diffusion coefficients, and thus two different outward diffusion speeds. The process of fabrication begins with a P-type silicon type substrate 101. Onto substrate 101, first buried region 103 is diffused (first masked diffusion) in a ring shape form. Since this will be the surrounding region requiring a faster diffusion coefficient, phosphorous atoms may be used as the impurity dopant. A second buried region 105 is then selectively diffused (second masked diffusion) into the area surrounded by first buried region 103. Since buried region 105 is to have a relatively slower diffusion coefficient, antimony atoms may be used as the impurity dopant. Both the first and second buried region are of the same conductivity type, N-type in the case of a P-type substrate. With these two diffusion steps completed, epitaxial layer 107, generally a few microns in thickness, and of the same conductivity type as substrate 101, is grown upon the same surface of substrate 101 as where the first and second buried regions 103 and 105 are located. During this epitaxial growth, the first and second buried regions 103 and 105 outdiffuse into epitaxial layer 107. Since the diffusion coefficient of the first buried region 103 is faster than the diffusion coefficient of the second buried region 105, the first buried region 103 outward diffuses faster and penetrates the epitaxial layer 107 deeper than the second buried region 105. In order to complete the semiconductor structure, collector contact region 109 and emitter region 111 are simultaneously diffused (third masked diffusion) into the surface of epitaxial layer 107. The impurities of collector contact 109 and emitter region 111 are of the second conductivity type. The resulting structure is a self-isolated transistor wherein contact 109 and regions 103 and 105 collectively constitute the collector region of the transistor; the area of epitaxial layer 107 surrounded by the collector region becomes the base region 113; and emitter region 111 functions as the emitter of the transistor.

The primary disadvantage of the process which results in the structure of FIG. 1A is that base region 113 is of a relatively low concentration. Only by means of a fourth masked diffusion step can the base region 113 be raised to sufficiently high concentration for the improved performance.

Figure 1B:
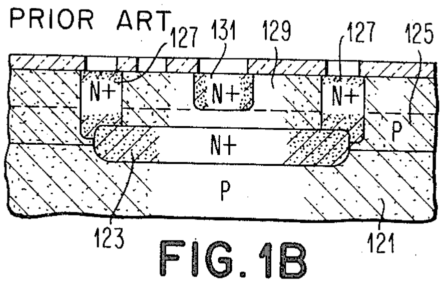

FIG. 1B shows the cross sectional view of a second prior art self-isolated semiconductor integrated circuit structure. The process by which the structure of FIG. 1B is fabricated begins with P-type silicon substrate 121. Onto substrate 121, buried region 123 is diffused (first masked diffusion). Various N-type diffusing impurities such as antimony, arsenic or phosphorous, depending on outdiffusing considerations, may be used to form this low resistivity buried region 123. Onto the same surface of substrate 121 in which buried region 123 is located, P-type epitaxial layer 125 is grown. Epitaxial layer 125 is relatively thin (on the order of a micron) and may be doped to provide substantially uniform resistivity. N-type collector contact 127 is then selectively diffused (second masked diffusion) into epitaxial layer 125, passing through epitaxial layer 125 and making contact with the periphery area of buried region 123. At this point, in order to increase somewhat the concentration of the base region 129, a nonselective diffusion process may be employed. However, this nonselective diffusion process is limited to maintaining the surface concentration lower than that of the collector contact 127. To complete the structure, emitter region 131 is then selectively diffused (third masked diffusion) into the surface of epitaxial layer 125 within the island created by collector contact 127, which is usually formed in a ring like shape.

As in the structure shown in FIG. 1A, the structure of FIG. 1B is a self-isolated transistor having a relatively low base concentration. And as before, only another masked diffusion process step can raise the concentration of base region 129 to higher levels.

It should be pointed out at this time that in the description of the processes of the structures shown in FIG. 1A and 1B as well as the processes discussed below, the well known photolithographic and oxide masking techniques employed in the various diffusion steps have been omitted from the discussion but not from the actual fabrication. Further, it is assumed that the electrical contact and interconnection techniques which take place after the formation of the structure, is well known and need not be discussed in detail here.

Figure 2:
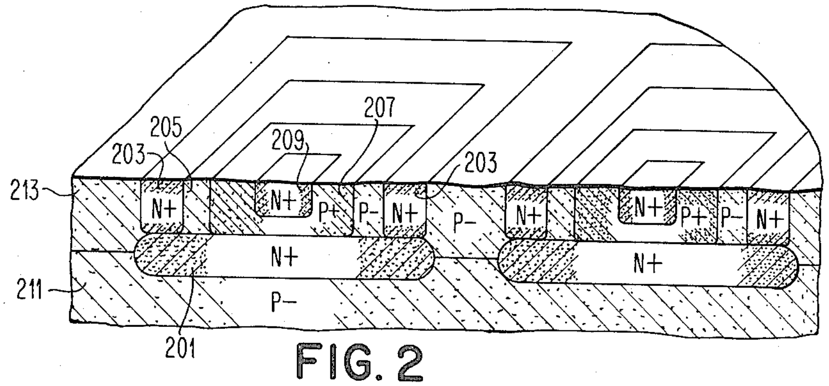
FIG. 2 shows a perspective cross-sectional view of the preferred embodiment of the invention.

FIG. 2 shows a perspective view of the preferred embodiment of the invention with a cross section showing the various impurity regions of two identical semiconductor devices. Basically, a self-isolated or junction-isolated NPN transistor device is shown in which buried region 201 in conjunction with collector contact region 203 constitutes the collector, epitaxial base region 205 and diffused base region 207 constitute the base of the transistor and diffused emitter region 209, constitutes the emitter of the device.

The process by which the structure of FIG. 2 is fabricated is demonstrated in FIGS. 3A–F. The fabrication process begins with a monocrystalline silicon wafer substrate 211, preferably manufactured to have uniform resistivity and a thickness on the order of a few mills. Silicon substrate 211 has a P-type conductivity with a low level concentration in the range of $10^{14}cm^{-3}$ to $10^{16}cm^{-3}$.

Figure 3A:
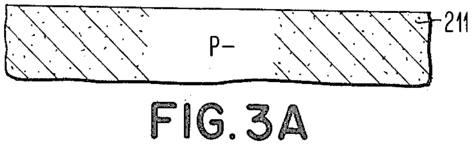
FIGS. 3A thru 3F show cross-sectional views of the wafer after successive fabrication steps leading to the preferred embodiments of the invention.
Figure 3D:
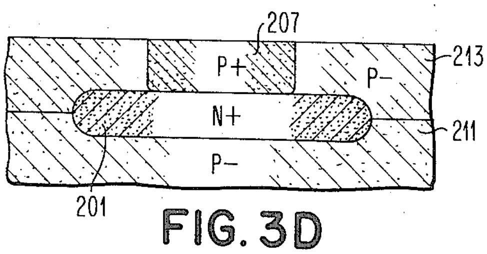
Figure 3B:
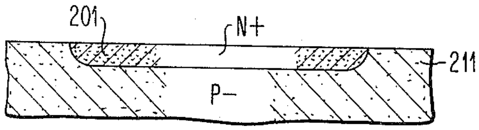

The next step in the fabrication process is illustrated in FIG. 3B and is a masked diffusion process in which buried region 201 is selectively diffused (first masked diffusion) into the surface of substrate 211. Buried layer 201 is an N-type region having a low resistivity, and a concentration level in the range of $10^{16}cm^{-3}$ to $10^{19}cm^{-3}$. Arsenic atoms or antimony atoms are convenient impurities to be used in this diffusion step. The choice of using a slow diffusing impurity such as arsenic or antimony or a faster diffusing impurity such as phosphorous depends primarily upon considerations of outdiffusion that takes place during epitaxial growth, the next step in the fabrication.

Figure 3E:
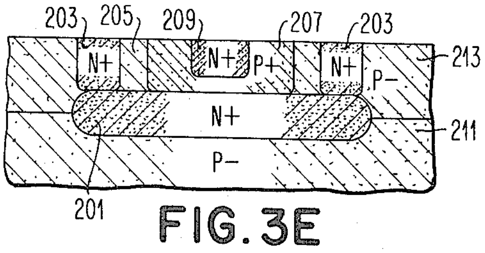
Figure 3C:
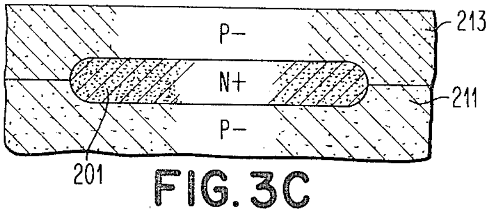

FIG. 3C illustrates the next step in the fabrication process, the growing of an epitaxial layer 213 on the surface of substrate 211 over the buried region 201. Epitaxial layer 213 is grown to an approximate depth of 2 microns and has a P-type conductivity type with a low level concentration in the range of $10^{14}cm^{-3}$ to $10^{16}cm^{-3}$. A uniform resistivity in the P-epi region 213 may be achieved through light doping of such impurities as boron atoms.

Following the growth of epitaxial layer 213, base region 207 is selectively diffused (second masked diffusion) into the exposed surface of epitaxial layer 213 as illustrated in FIG. 3A. This diffusion takes place directly above buried layer 201, base region 207 being diffused through epitaxial layer 213 to form a common boundary with buried region 201. A suitable impurity for this diffusion step is boron, raising the impurity concentration of the P-type base region 207 into the range of $10^{16}$ $cm^{-3}$ to $10^{19}$ $cm^{-3}$.

FIG. 3E illustrates the final selective diffusion step in which collector contact region 203 and emitter region 209 are simultaneously diffused (third masked diffusion) into the surface of epitaxial layer 213. Emitter region 209 is diffused into the surface of epitaxial layer 213 within the region of the diffused base region 207, and collector contact region 203 is diffused into the epitaxial layer directly above the periphery of the buried layer region 201, forming a ring around, but spaced from, base region 207. A suitable impurity for this diffusion step is arsenic, the emitter region 209 and the collector contact region 203 becoming N-type regions of low resistivity. This diffusion step continues until collector contact region 203 has passed completely through epitaxial layer 213, making contact with buried region 201. Simultaneous with the diffusion of collector contact region 203, emitter region 209 diffuses into base region 207. However, since the base region 207 has a much higher impurity concentration than the P-type epitaxial layer 213, diffusion penetration of base region 207 by emitter region 209 is substantially less. In other words, the speed at which collector contact region 203 diffuses into epitaxial layer 213 is faster than the diffusion of emitter region 209 into base region 207. Various impurities may be used in this diffusion process such as arsenic, antimony or phosphorous. If phosphorous atoms are used as the impurity during the emitter diffusion, push out effect requires deeper penetration of emitter diffusion. This insures that collector contact 203 will reach buried region 201. For certain designs of emitter diffusion, collector contact 203 does not punch through the P-type epitaxial layer 213; in such a case, a bias of a few volts on the substrate 211 will respect to collector contact region 203 may be applied to achieve punch through. For a 2 ohm-centimeter epitaxial layer, approximately 0.4 volts is required to punch through over 10 microns.

Figure 3F:
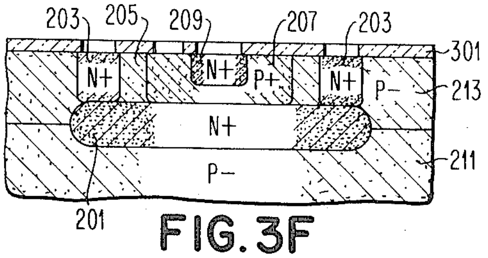

With the various regions of the semiconductor device formed, an oxide layer 301, silicon dioxide for example, is present in the surface of the device as illustrated in FIG. 3F. Holes are made in the oxide layer for the later application of contacts to the various regions of the semiconductor device.

With the higher concentration in base region 207, base stretching phenomonon is considerably reduced. Further, when impurities of a low coefficient of diffusion are employed to form buried région 207, side diffusion of buried region 201 during the epitaxial growth is reduced. These two factors, either individually or jointly, permit smaller transistor geometry and closer spacing of the devices, thus increasing the yield.

Further advantages of the invention exist with respect to the structure of FIG. 1A. The prior art structure of FIG. 1A relies on outdiffusion during fabrication. Control of this outdiffusion process is not as exact as control of diffusion from the surface into the epitaxial layer. Further, outdiffusion during epitaxial growth in the prior art structure of FIG. 1A results in a wing formation which may be undesirable.

For certain designs, particularly where a thicker epitaxial layer is desired in order to relax the required control of the epitaxial process, it may be advantageous to use a mixed impurity source of arsenic and phosphorus, for example, for the emitter and collector ring diffusions. In such cases, the phosphorus concentration is made lower than the base concentration but higher than the epitaxial layer impurity concentration. The emitter is formed substantially in the same way as if arsenic alone were present because the phosphorus does not penetrate beyond the arsenic in the base region due to the lower concentration of the phosphorus relative to the base impurity concentration. However, the phosphorus reaches deeper than the arsenic into the epitaxial layer to assure complete reach through to the buried collector region due to the higher concentration of the phosphorus than the epitaxial layer impurity concentration and the higher diffusion co-efficient of phosphorus relative to that of arsenic. It should also be noted, of course, that if another N diffusion step is to be used for the formation of a resistor, for example, in addition to the transistors of FIG. 2 in an integrated circuit device, the same resistor masking steps can be used to open the collector contact ring area 203 to enhance the reach through to buried collector region 201.

It will be understood that the described process is applicable to a plurality of transistors and other devices being fabricatd simultaneously. For example, the processes and steps disclosed in this invention may be employed to fabricate pinch resistors. Also, while the invention has been described in terms of particular conductivity types, it is understood that the conductivity types may be reversed.

In summary, the disclosed process results in a semiconductor structure in which high base concentrations are achievable without increasing the number of masked diffusion process steps necessary to fabricate existing structures of lower performance. Maintaining the number of masked diffusion steps at a minimum results in high yield.

While the invention has been particulary shown and described with reference to the preferred embodiment thereof, it will be understood by those of skill in the art that various changes in form and details may be made therein without departing from the spirit and scope of the invention.

I claim:

1. A process for the fabrication of collector self-isolated semiconductor integrated circuit structures comprising the steps of:

diffusing into a first surface of a body of semiconductive material of a first conductivity type, a buried collector region of a second conductivity type;

depositing an epitaxial layer of semiconductive material of said first conductivity type onto said first surface of said body;

diffusing into the surface of said epitaxial layer and within the area encompassed by said buried collector region, a base region of said first conductivity type extending down to said buried collector region, said base region having a conductivity enhancing dopant concentration substantially larger than the conductivity enhancing dopant concentration of said epitaxial layer so that said base region and epitaxial layer form two distinct regions of said first conductivity type in said epitaxial layer, each having verically continuous dopant concentrations;

simultaneously diffusing an emitter region within said base region and a collector contact region in said epitaxial layer encompassing and spaced from said base region and within the area encompassed by said buried collector region;

said emitter and collector contact regions being of said second conductivity type and having a concentration sufficient to cause said collector contact region to contact said buried collector region and to cause the conductivity enhancing dopant concentration contour said emitter region to be abruptly compensated by the first conductivity type dopant in said base region at the desired base width above said buried collector region in said base region;

whereby a high speed, self-isolated semiconductor device may be fabricated.

2. The process for fabricating a collector self-isolated semiconductor integrated circuit structure of claim 1, wherein said epitaxial layer of said first conductivity type is formed with a concentration level of approximately $10^{16}$ atoms per cubic centimeter and wherein the base region of said first conductivity type is formed with a concentration level in the range of $10^{18}$ atoms per cubic centimeter to $5\times10^{18}$ atoms per cubic centimeter.

* * * * *